United States Patent [19]
Kanoo

[11] Patent Number: 5,121,707
[45] Date of Patent: Jun. 16, 1992

[54] APPARATUS FOR COATING MATERIALS IN A VACUUM CHAMBER

[75] Inventor: Shyamal K. Kanoo, Tsuen Wan, Hong Kong

[73] Assignee: QPL Limited, Hong Kong

[21] Appl. No.: 565,329

[22] Filed: Aug. 10, 1990

[30] Foreign Application Priority Data

Aug. 16, 1989 [GB] United Kingdom ............... 8918728

[51] Int. Cl.[5] .............................................. C23C 16/44
[52] U.S. Cl. ................................... 118/725; 118/715;
118/724; 118/726; 118/730; 414/172;
427/248.1; 427/251; 427/255.5
[58] Field of Search ............... 118/724, 726, 730, 715,
118/728, 725; 427/248.1, 251, 255.5;
204/298.09, 298.15, 298.28; 422/200, 244;
414/150, 172, 422, 468

[56] References Cited

U.S. PATENT DOCUMENTS

| | | | |
|---|---|---|---|
| 3,962,082 | 6/1976 | Hundal | 210/773 |
| 4,116,161 | 9/1978 | Steube | 118/715 |
| 4,138,306 | 2/1979 | Niwa | 118/715 |
| 4,704,301 | 11/1987 | Bauer et al. | 427/295 |
| 5,010,035 | 4/1991 | Bunshah et al. | 427/249 |

FOREIGN PATENT DOCUMENTS

| | | | |
|---|---|---|---|
| 573380 | 3/1959 | Canada | 427/251 |
| 0255965 | 2/1988 | European Pat. Off. | |
| 1068587 | 6/1954 | France | 427/251 |
| 1076428 | 7/1967 | United Kingdom . | |
| 1529418 | 10/1978 | United Kingdom . | |
| 2125830 | 3/1984 | United Kingdom . | |

*Primary Examiner*—Shrive Beck
*Assistant Examiner*—Terry J. Owens
*Attorney, Agent, or Firm*—Pollock Vande Sande & Priddy

[57] ABSTRACT

An aluminium vacuum deposition machine for coating parts of lead frames, having a vacuum chamber containing the lead frames and aluminium to be vaporized. To reduce the incidence of imperfections in the aluminium coatings, a meissner trap is positioned within the vacuum chamber itself rather than or in addition to a meissner trap adjacent to a diffusion pump. Also, to reduce the thermal mass within the chamber, a support jig for the lead frames comprises a pair of end rings and a bracer member joining the end rings and holding them apart. Two pairs of spaced rollers are arranged in the chamber so that each ring rests on a respective pair of rollers, and the rollers are driven so that the support jig is rotated during vacuum deposition.

9 Claims, 5 Drawing Sheets

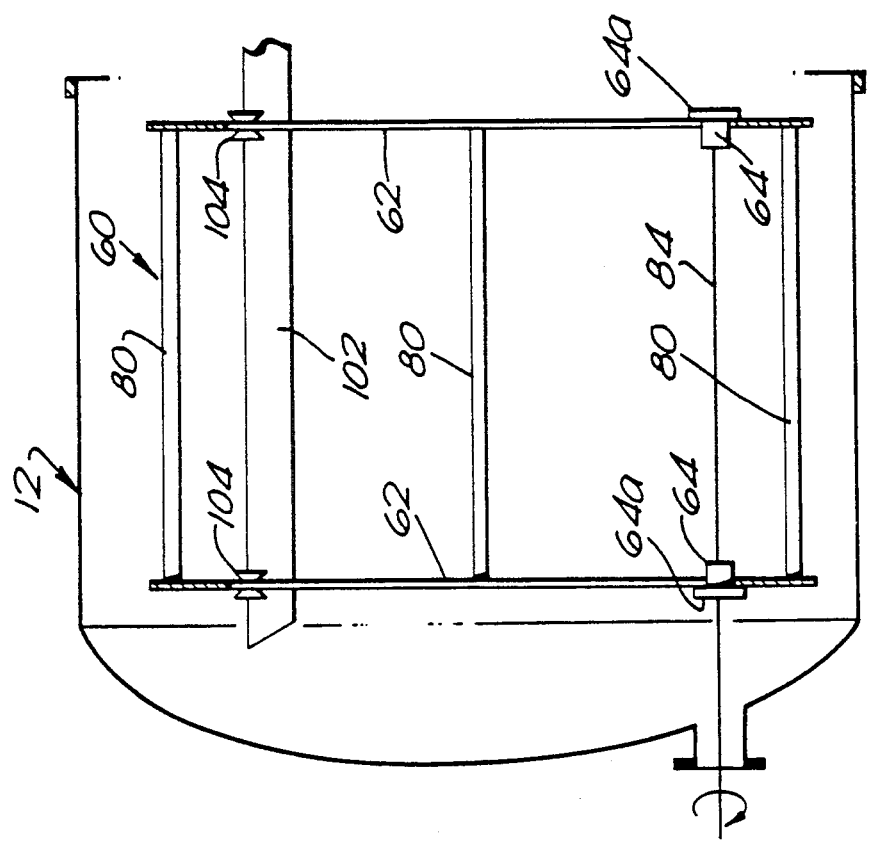
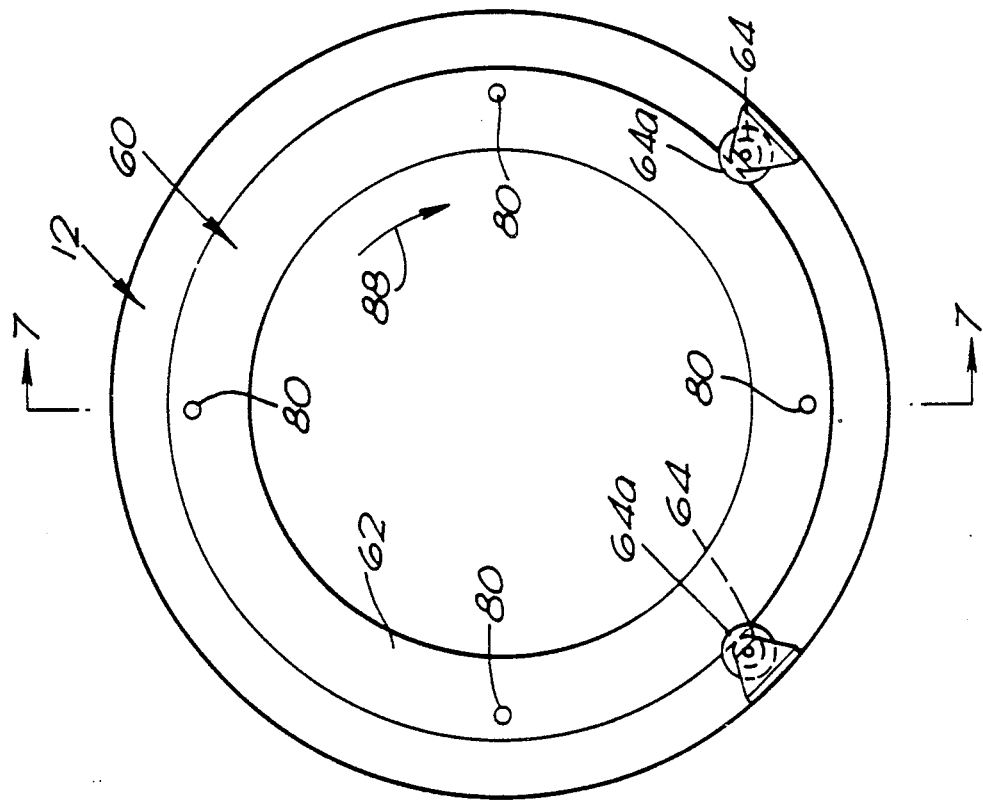

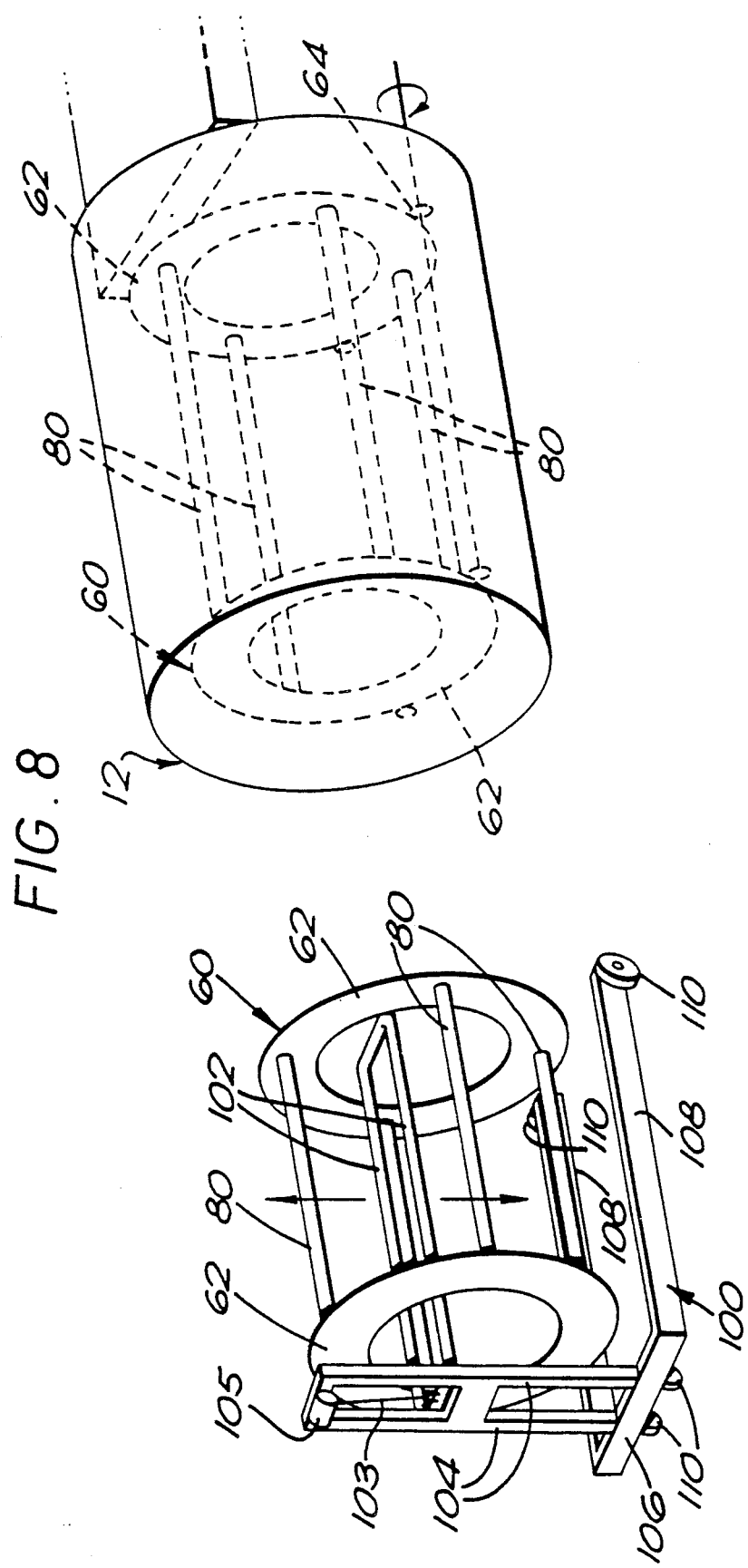

APPARATUS FOR COATING MATERIALS IN A VACUUM CHAMBER

This invention relates to improvements in apparatus for coating materials in a vacuum chamber. In particular the invention relates to machines for the vacuum deposition of aluminium onto the lead frames for IC chips.

BACKGROUND TO THE INVENTION

In the past lead frames for IC chips have usually been given a thin coating of gold or silver on the areas to which the conductive gold wires are to be attached so as to give a good bond between the wire and the lead frame. Recently, however, there has been a move to the use of aluminium wire to replace the expensive gold wire and as a result there is a need to coat selected areas of the lead frame with aluminium so that a good bond can be achieved with the aluminium wire.

Thin aluminium coatings are generally applied by vacuum deposition in which the item to be coated is placed in a chamber under a very high vacuum and a piece of aluminium is heated so that it evaporates and the evaporated molecules then condense onto surfaces surrounding it, such as the surfaces of lead frames which are placed in the chamber.

There are however, problems and one problem which arises particularly in Hong Kong and in areas of high humidity is the difficulty of adequately removing water molecules from the vacuum chamber. Thus even the presence of stray molecules may lead to less than perfect results in the aluminium deposition. When the resulting lead frames are checked, if any imperfection is seen. the blank carrying it is discarded. Thus, since one cannot separate out the defective frame and still apply automatic production, the imperfection results in the loss of a blank carrying not only the single defective lead frame but perhaps ten to twenty others which are in fact perfect but which are all still part of the same metal blank. Losses are therefore magnified and represent a serious increase in costs.

The invention has therefore been made with this in mind and aims to provide an improved aluminium deposition machine for lead frames.

BRIEF SUMMARY OF THE INVENTION

According to the invention in one aspect there is provided an aluminium vacuum deposition machine for coating parts of lead frames, comprising a high vacuum chamber designed to contain the lead frames to be coated and a source of aluminium to be vaporized, means for heating the aluminium to vaporize it, high vacuum means for evacuating the chamber before vacuum deposition starts, and a Meissner trap, that is to say an extended surface cooled to a very low temperature by a liquified gas such as liquid air or liquid nitrogen, which is provided within the vacuum chamber itself and on which residual water molecules will condense and freeze.

In high vacuum work a Meissner trap can be provided adjacent to the diffusion pump itself so as to remove water at that point. We have found however, that this is not sufficiently effective in high humidity climates like Hong Kong to remove enough of the water molecules from the high vacuum chamber to avoid significant interference with the vacuum deposition and imperfections in the final coatings. By providing the Meissner trap in the chamber itself however, we have found that one can largely eliminate water droplets from the highly evacuated region before the aluminium deposition commences, with the result that there is substantial reduction in imperfections in the aluminium deposition.

The Meissner trap can be an extended surface (e.g. a tube or the like with fins attached to it) and a supply of, for example, liquid nitrogen, is circulated through the tube.

It is also possible for an additional Meissner trap be provided adjacent to the vacuum diffusion pump itself to assist in obtaining a high vacuum.

Generally speaking, at least in the upper region of the vacuum chamber, heaters are provided to ensure that all adhering gaseous molecules are driven off, particularly from the lead frames, and that these be heated to promote nucleation when the aluminium is deposited. In addition it is in the upper region of the chamber that the aluminium deposition takes place since the aluminium to be evaporated will normally be placed on a crucible or receptacle and so its evaporating molecules can then radiate upwardly and to some extent sidewardly but not downwardly. We have found therefore that a convenient position for the Meissner trap or coil is beneath the receptacle on which the aluminium is placed for evaporation, since it is then not too close to the heaters to prevent water from freezing on the trap.

Conveniently the Meissner trap is a zig-zag length of tubing provided with fins or the like to give it an extended surface area.

To increase productivity, the vacuum chamber will generally be quite large and a substantial number of blanks of lead frames will be coated at the same time in one operation lasting perhaps one to two hours. Accordingly a very substantial load and weight of the lead frames blanks needs to be loaded into and unloaded from the vacuum chamber and generally this has involved the use of a massive support jig to carry the weight during coating and during loading. To reduce the time of a vacuum coating operation it is desirable to reduce to a minimum the mass of this support jig so as to reduce the mass which has to be heated and so the time for heating and it is accordingly an object of a further aspect of the invention to provide an improved support arrangement.

According to this further aspect of the invention, there is provided an aluminium vacuum deposition machine for coating parts of lead frames, comprising a high vacuum chamber designed to contain the lead frames to be coated and a source of aluminium to be vaporized, means for heating the aluminium to vaporize it, high vacuum means for evacuating the chamber before vacuum deposition starts, a support jig for the lead frames to be coated, the support jig comprising a pair of end rings and bracer members joining the rings and holding them spaced apart, roller means within the chamber comprising two pairs of spaced rollers arranged so that each ring rests on a respective pair of rollers, and means for rotating the roller means during the vacuum deposition to thereby rotate the support jig.

Preferably the outer periphery of each ring rests on a respective pair of rollers.

With such an arrangement the support jig can be simple and of relatively light-weight construction. Also the roller means can be of relatively small thermal mass which enables one to reduce the time of the heating during a cycle of the vacuum deposition, so increasing the productivity of the machine. Further the arrangement of the roller means is a very secure and safe means for supporting the structure and in addition is relatively quiet in operation.

Conveniently the rollers have a knurled rolling surface so that there is good frictional contact between the rollers and the end rings. In this way the rollers can be driven to rotate the jig and there will then be good rotational drive engagement which can be quiet in comparison with say using a gear drive arrangement.

The support jig when loaded with the lead frames and their masks will be quite heavy to maneuver during loading and unloading. However with this arrangement for supporting the structure in the machine, according to one embodiment of the invention one can additionally provide a trolley arrangement comprising cantilever means capable of extending through the two rings and supporting the structure with the inside peripheries of the rings resting on the cantilever means. Also the trolley arrangement includes wheels for moving the trolley arrangement around whilst carrying the support jig. The cantilever means can conveniently themselves be a pair of spaced arms with means provided for raising and lowering those arms.

DESCRIPTION OF THE DRAWINGS

The invention will now be illustrated, by way of example, with reference to the accompanying drawings, in which:

FIG. 6 is a view through the open door of the vacuum chamber showing the support jig for the lead frame blanks;

FIG. 7 is a section taken along the line 7—7 of FIG. 6 but additionally showing the arms of a jig for lifting the support jig;

FIG. 8 is a perspective diagram illustrating the manner of loading and unloading of the apparatus.

DESCRIPTION OF THE PREFERRED EMBODIMENT

Figure 1:
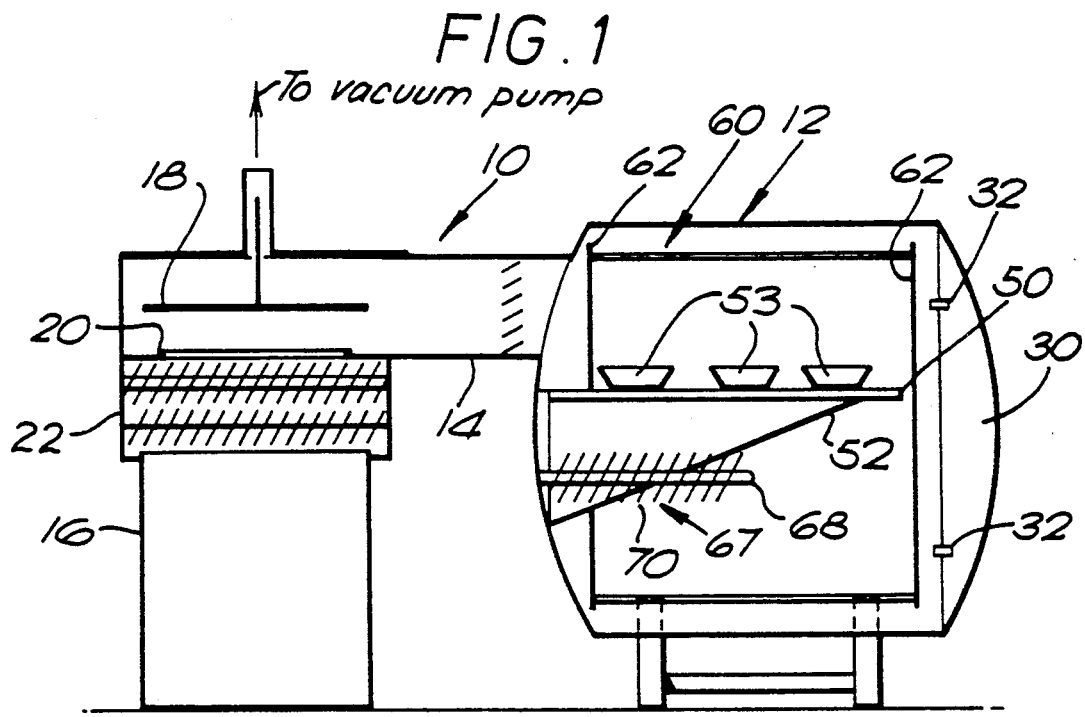
FIG. 1 is a general side view, with some interior details shown, of an aluminium deposition apparatus according to the invention.

The vacuum deposition apparatus 10 shown in the drawings includes a vacuum chamber 12 linked by means of a manifold 14 to a vacuum pump not shown in detail. In addition, a diffusion pump 16 is provided to ensure the formation of a very high vacuum within the chamber 12. The diffusion pump does not, however, come into operation until the vacuum pump has reduced the pressure to a very low figure as is conventional and a valve 18 is provided to cover an inlet port 20 to the diffusion pump whilst the mechanical vacuum pump initially reduces the pressure.

As described, this apparatus is largely conventional for a vacuum coating apparatus and in general terms no further description of the vacuum pump and the diffusion pump and their operation is felt to be necessary.

The vacuum chamber itself can also be of largely conventional construction. It is of generally cylindrical shape and includes a front circular door 30 provided with hinges 32 and a lock 34. The door can be opened for access when there is no vacuum in the chamber.

Figure 4:
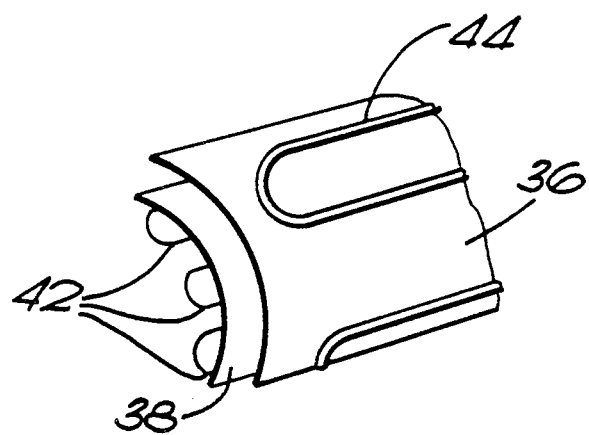
FIG. 4 is a perspective detail showing the construction of the vacuum chamber.

The chamber 12, including the door 30, includes an outer casing 36 and within this is provided a heat insulating baffle 38. Facing radially inwardly from that baffle and over the upper region of the chamber are provided infra red heaters 42 (see FIG. 2 and 4). To keep the chamber 12 cool, it has adhered to its outside surface cooling tubes 44 through which cooling water or the like is circulated.

Again this type of construction is believed to be largely conventional in connection with vacuum deposition machines and is not believed to require further detailed explanation.

Mounted within the chamber and parallel to the axis of the cylindrical wall of the chamber is provided a support 50 including a cantilever arm 52 on which a number of crucibles 53 for the source of aluminium are placed. The source of aluminium can be pellets or the like (not shown) and their positioning and arrangement is not shown in detail since again this is believed largely to be conventional.

To heat the aluminium pellets so that the aluminium vaporizes once a high vacuum has been created, three E-beam sources, not shown, are provided, one for each crucible 53. Again that is a conventional manner of heating the aluminium pellets to evaporate them. Other conventional arrangements are possible including heating the sources by placing them close to a high temperature electrical heater.

Mounted over the crucibles 53 are a number of shutters 56 which shield the crucibles in the initial stage of heating the aluminium pellets. Thus, whilst the pellets are melting, there is liable to be some spitting or the like from the aluminium and the shutters prevent this from reaching the lead frames. Once the aluminium is fully melted however the shutters are retracted to allow the aluminium vapour to radiate out from the crucibles.

Figure 2:
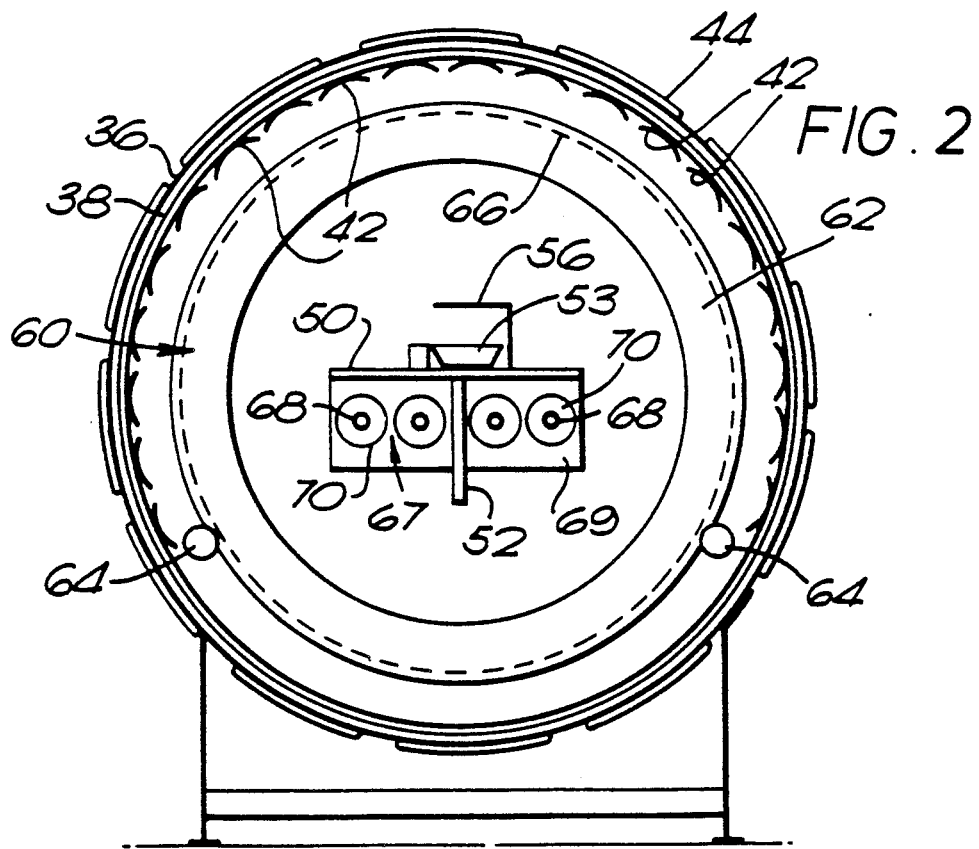
FIG. 2 is an enlarged cross-section through the vacuum chamber.
Figure 3:
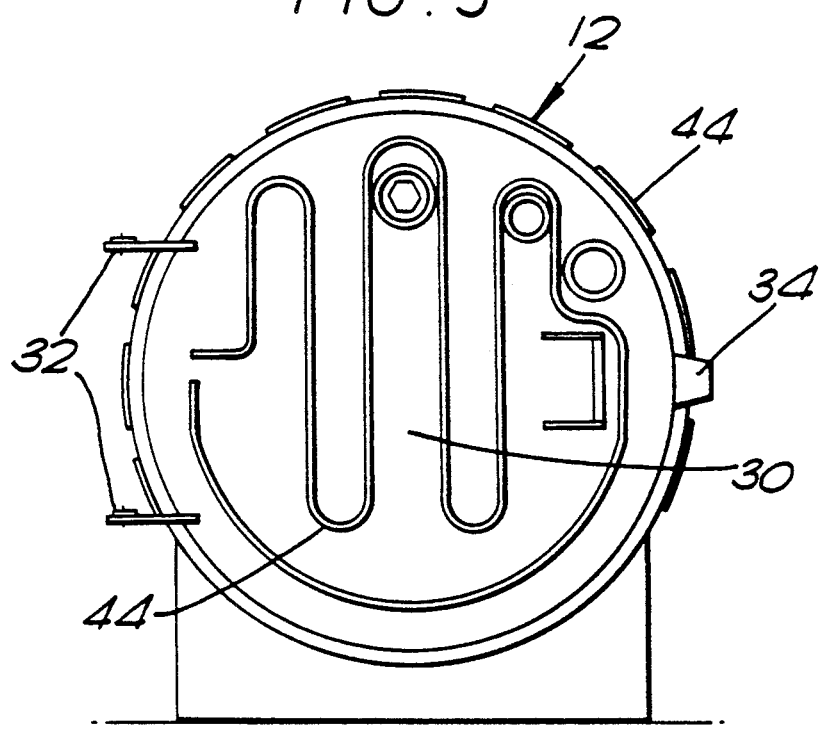
FIG. 3 is a front view of the chamber.
Figure 9:
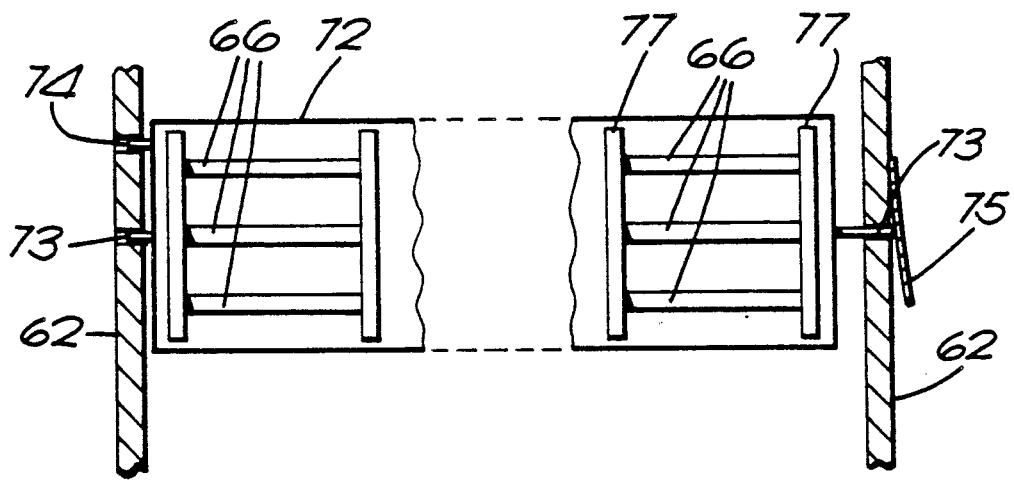
FIG. 9 is a diagrammatic sectional detail illustrating the way in which the lead frames and their masks are carried by the support jig.

Within the chamber 12 is provided a support jig 60 for the lead frames to be coated. This jig 60 is not shown in any detail in FIGS. 1 and 2 but generally comprises a pair of end rings 62 which are supported on rollers 64 to rotate the support jig during the vacuum deposition process. The rings 62 are joined by axially extending struts 80, shown in FIGS. 6 and 7, to keep the whole jig rigid. In the space between the rings 62 a large number of lead frames 66 are mounted as is best shown in FIGS. 2 and 9. The support jig 60 will be described in more detail in due course but it is believed that this brief description is sufficient to explain the general principle of the aluminium deposition at this stage.

Below the support 50 is provided a Meissner trap 67. This is positioned within the chamber 12 itself and extends into the chamber. This trap comprises a zig-zag length of tube 68 provided with fins 70 to give it an extended surface area. The tube 68 is cooled by means of a liquefied gas such as liquid nitrogen. A shield 69 is provided to prevent the infra red radiation from the heaters 42 from directly impinging on the tube 68. The tube is also shielded from above by the support 50.

In general the apparatus 10 operates by inserting a support jig 60 carrying a large number of lead frames through the open door 30 followed by closing this. Then the vacuum pump reduces the pressure within the chamber and is left to operate until it has reached a point where a low vacuum has been introduced. The diffusion pump is started and the Meissner trap 67 is cooled. Next the valve 18 is raised to allow access to the diffusion pump which further reduces the pressure within the chamber 12 over a period of time. Also the heaters 42 have been energised to remove adhered gases from the chamber walls, from the support jig and from the lead frames and their masks. Also the heating prepares the lead frames for nucleation of the aluminium onto their surfaces. Meanwhile the overall outer surface of the chamber 12 is kept cool by the cooling water circulating through the tubes 44.

Figure 5:
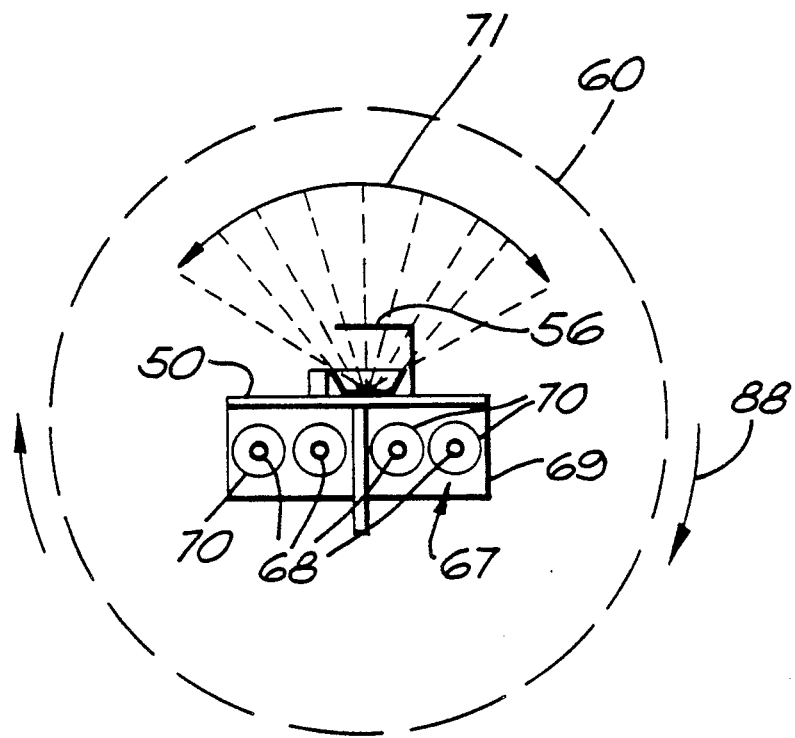
FIG. 5 is a diagram illustration the way in which the aluminium deposition occurs.

Once the diffusion pump has reduced the pressure to an extremely low level and the Meissner trap 67 has collected stray water molecules still within the chamber, the E-beams are activated to melt the aluminium pellets. Once they have completely melted, the shutters 56 are moved clear of the crucibles and so the aluminium can then evaporate radially outwardly in the region marked by the arrow 71 in FIG. 5. As best shown in FIG. 5, the support jig 60 is meanwhile rotated continuously in the direction of the arrow 88 and the lead frames which are carried by it are successively brought into the region 71 into which the evaporating aluminium radiates. In this way by means of successive passes through this region, eventually a sufficient thickness of aluminium will be built up on the regions of the lead frames to be coated.

Once this point is reached, the heating by the E-beams is stopped and the apparatus allowed to cool and stabilize. Finally the valve 18 to the diffusion pump is closed and the vacuum pump stopped, and once the apparatus has cooled sufficiently, air is again allowed into the chamber 12 to equalize the pressures. The support jig 60 can thereafter be removed through the door 30 and a new cycle commenced.

The diffusion pump 16 includes a conventional cryogenic trap 22 located just beneath its inlet 20. This trap 22 assists in obtaining a high vacuum. The positioning of the Meissner trap 67 within the chamber 12 is found to give enhanced removal of stray water molecules over and above that which is possible using the cryogenic trap 22 and, therefore, it is found that there are fewer imperfections on the resulting aluminium coated lead frames.

The support jig 60 is shown in more detail in FIGS. 6 to 8. This comprises the pair of end rings 62 and these are held spaced apart by means of the four struts 80 equally positioned around the rings. The ends of struts 80 are welded or otherwise suitably joined to the rings 62.

The rollers 64 have outer knurled surfaces and support the outer peripheries of their respective rings 62. Also the rollers have integral side flanges 64a. When the support jig 60 is in position in the chamber 12, the rings 62 rest solely on rollers 64. A pair of rollers is provided towards the front end of the chamber and a corresponding pair is provided at the rear. The flanges 64a guide the rings as the support jig is rotated. One pair along one side of the chamber is joined on a common shaft 84 and drive means, not shown, are provided to rotate that shaft as the vacuum deposition process proceeds. Thus, whilst the aluminium is being deposited, the support jig 60 is continuously rotated, for example in the sense of the arrows 88 shown in FIGS. 5 and 7, by rotation of the shafts 84 and the rollers 64 which are mounted on it.

As best shown in FIG. 9 a backing plate 72 can be mounted between the end rings 62 by spigots 73 and 74 which extend through corresponding holes (not shown in FIG. 6) in the rings 62. A spring arm 75 urges the plate to the left, in the sense seen in FIG. 9, to hold the left and right hand spigots 73 and the spigot 74 in their respective holes. A plate can be removed, however, by moving it to the right against the action of the spring arm 75, to release the spigot 74 and the left hand spigot 73, followed by withdrawal of the right hand spigot 73 from its respective hole. Mounted on each of these plates are a large number of lead frame blanks 66 and their masks. These are held on their plate 72 by straps 77.

It will be seen that within the chamber itself during the vacuum deposition process, there are only a very small number of parts required to support the jig 60 and to rotate it. Additionally no special parts are required in the chamber to assist in the insertion or removal of the support jig. This is important since this reduces the overall thermal mass within the chamber 12 and so it is possible to heat up the interior of the chamber more quickly and often therefore possible to reduce the overall time taken for a vacuum deposition step.

Further the supporting of the jig 60 on the rollers 64 is very secure and there is little risk of the support jig coming adrift during operation. The arrangement can also operate relatively quietly which is in contrast with previous arrangements.

Finally the support jig itself is of simple and relatively light-weight construction. However, the support jig 60 together with the large number of lead frames and their masks supported on it is itself of large mass and so a trolley arrangement 100 is provided for holding a jig 60 whilst it is loaded or unloaded and for inserting or removing it from the chamber 12.

This trolley arrangement 100 comprises cantilevered support arms 102 which extend through the rings 62. These arms have small idler rollers 104 on which the interior peripheries of the rings 62 rest. The cantilevered arms 102 are supported on uprights 104 which are in turn connected to a base 106. The arms 102 hang from a length of wire 103 and can be raised and lowered relative to the uprights 104 by a winch 105.

The base 106 has forwardly extending arms 108 on which are rotatably mounted wheels 110. The wheels 110 and the arm 108 can project in under the vacuum chamber 12 during a loading or unloading operation.

The use of the cantilevered arms for the trolley arrangement 100 is very secure and safe and there is little chance of the heavy loaded support jig 60 falling from the arrangement. Also the arrangement 100 can readily be moved and maneuvered into a position for loading or unloading.

In a typical loading operation the jig 60 is provided with a supply of lead frames and their masks to be coated. Then the door of the chamber 12 is opened and the arrangement 100 maneuvered so as to place the jig 60 within the chamber. The wire 103 is lowered so that the arms 102 lower the support jig 60 to a position where the outer peripheries of the rings 62 rest on and engage the rollers 64. The arms 102 can be lowered further and then the trolley arrangement is free to be removed and the door 30 shut. A vacuum deposition cycle can then be started as has been described.

Whilst one vacuum deposition is proceeding, a further support jig on its own trolley arrangement 100 can be unloaded and then reloaded with fresh lead frames. Then, once a current vacuum deposition cycle is complete and the jig 60 removed, this fresh jig 60 can then be loaded into the chamber for a subsequent cycle of operation.

To unload the jig 60 from the chamber, the trolley arrangement 100 is moved so that the arms 102 extend into the chamber 12 through the openings in the rings 62. Then the arms 102 are raised to lift the jig 60 from the rollers 64 and to take the weight of the structure, and the trolley arrangement can then be pulled clear of the chamber 12 so removing the jig 60.

A latitude of modification, change and substitution is intended in the foregoing disclosure and in some instances some features of the invention will be employed without a corresponding use of other features. Accordingly it is appropriate that the appended claims be construed broadly and in a manner consistent with the spirit and scope of the invention herein.

I claim:

1. A vacuum deposition machine useful for applying coatings in high humidity environments comprising:
   a vacuum deposition chamber;
   a radiant heat source on the inside of said chamber, for heating a substrate supported therein;
   an extended cooling surface in said deposition chamber for trapping water molecules;
   a member in said deposition chamber interposed between said cooling surface and said radiant heat source for blocking passage of radiant energy from said radiant heat source to said cooling surface;
   vacuum means connected with said chamber for creating a vacuum in said chamber; and
   means for vaporizing a metal and applying said vaporized metal to said substrate in said chamber.

2. A vacuum deposition machine according to claim 1 in which said extended cooling surface within said chamber comprises a zig-zag length of tubing provided with fins and means for circulating liquified refrigerant gas through said length of tubing.

3. A vacuum deposition machine useful for coating at least parts of lead frames for integrated circuits, comprising:
   a high vacuum deposition chamber having an upper region for containing the lead frames while being coated;
   a radiant heat source in said upper region for driving gaseous molecules from the surfaces of said frames;
   an extended cooling surface in said deposition chamber, spaced apart from said radiant heat source, and connected with means for cooling said surface to freeze water molecules and retain said molecules on said surface during vacuum deposition;
   a supporting member for supporting vaporizeable metal in said vacuum deposition chamber, said member including means for blocking passage of radiant energy from said radiant heat source to said extended cooling surface;
   vacuum means for evacuating said chamber; and
   means for heating said metal to the vaporizing temperature of said metal.

4. A vacuum deposition machine according to claim 3 in which said extended cooling surface within said chamber comprises a zig-zag length of tubing provided with fins and said means for cooling comprises means for circulating liquified refrigerant gas through said length of tubing.

5. A vacuum deposition machine according to claim 3 wherein
   said high vacuum deposition chamber is cylindrical and has a longitudinal axis and means for supporting and repeatedly orbiting said frames in a circular path about said longitudinal axis and through said upper region,
   said radiant heat source comprises a plurality of radiant heaters positioned over an inner surface of said upper region to radiate heat inwardly toward said lead frames,
   said supporting member supports a source of aluminum positioned within said chamber for directing vaporized aluminum toward said upper region and depositing said aluminum on said lead frames as they orbit through said upper region, and
   said means for cooling comprises means for circulating refrigerant gas within said extended cooling surface for condensing and freezing residual water molecules, said extended cooling surface being beneath said supporting member, whereby said supporting member shields said extended cooling surface from said radiant heat source and from said vaporized aluminum.

6. A vacuum deposition machine according to claim 5 in which said extended cooling surface within said chamber comprises a zig-zag length of tubing provided with fins and said means for circulating refrigerant gas comprises means for circulating liquified air or nitrogen through said length of tubing.

7. A vacuum deposition machine according to claim 1, 3 or 5 wherein:
   a support jig, which is readily and fully insertable into and separable from said chamber, is provided for supporting said substrates within said chamber, said support jig comprising a pair of rings, brace members joining said rings and holding said rings spaced apart, and an array of substrate securing members positioned between said rings; and
   said chamber includes roller means within said chamber for rotatably supporting said jig, and means for rotating said jig on said roller means to thereby orbit said substrates in a circular path during vacuum deposition.

8. A vacuum deposition machine according to claim 7 including a trolley apparatus comprising a moveable base, pillar means upstanding from said base, and horizontal arm means extending outwardly from said pillar means, said arm means being engageable with said rings for supporting and transporting loaded and unloaded jigs and inserting loaded jigs into and removing unloaded jigs from said chamber.

9. A vacuum deposition machine according to claim 1, 3 or 5 in which said vacuum means includes a vacuum diffusion pump and an additional extended cooling surface adjacent to said vacuum diffusion pump.

* * * * *